(12) United States Patent
Roy et al.

(10) Patent No.: US 7,074,684 B2
(45) Date of Patent: Jul. 11, 2006

(54) ELEVATED SOURCE DRAIN DISPOSABLE SPACER CMOS

(75) Inventors: Ronnen A. Roy, Ossining, NY (US); Cyril Cabral, Jr., Ossining, NY (US); Christian Lavoie, Ossining, NY (US); Kam-Leung Lee, Putnum Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 10/894,219

(22) Filed: Jul. 19, 2004

(65) Prior Publication Data

US 2004/0266124 A1    Dec. 30, 2004

Related U.S. Application Data

(62) Division of application No. 10/172,649, filed on Jun. 14, 2002, now Pat. No. 6,777,298.

(51) Int. Cl.
*H01L 21/336*    (2006.01)

(52) U.S. Cl. ............... 438/300; 438/305; 438/586; 438/924

(58) Field of Classification Search ........ 438/229–231, 438/299–301, 303, 305, 586, 595, 664, 924
See application file for complete search history.

(56) References Cited

U.S. PATENT DOCUMENTS

| | | | |
|---|---|---|---|
| 5,320,974 A | 6/1994 | Hori et al. .................. 437/44 |
| 5,744,395 A | 4/1998 | Shue et al. ................. 438/305 |
| 5,770,507 A | 6/1998 | Chen et al. ................ 438/305 |
| 5,780,350 A | 7/1998 | Kapoor ...................... 438/305 |
| 6,121,100 A | 9/2000 | Andideh et al. ............ 438/305 |
| 6,277,683 B1 * | 8/2001 | Pradeep et al. ............ 438/200 |
| 6,429,084 B1 * | 8/2002 | Park et al. ................. 438/305 |
| 6,492,670 B1 | 12/2002 | Yu ............................. 257/284 |
| 6,583,016 B1 | 6/2003 | Wei et al. .................. 438/303 |

OTHER PUBLICATIONS

Wolf, Ph.D., Stanley, "Hot-Carrier-Resistant Processing and Device Structures," Silicon Processing for the VLSI Era vol. 3—The Submicron MOSFET, Lattice Press, 1995, pp. 608-611.*
A 0.1-um CMOS Technology with TIlt-Implanted Punchthrough Stopper (TIPS).
High Carrier Velocity and Reliability of Quarter-Micron SPI (Self-aligned Pocket MOSFITS.
1997 55th Annual Device Research Conference Decision.
Halo Doping Effects in Submicron Di-LDD Device Decision.
CMOS Devices below 0.1um: How High Will Performance Go?.

* cited by examiner

*Primary Examiner*—Mary Wilczewski
*Assistant Examiner*—Toniae M. Thomas
(74) *Attorney, Agent, or Firm*—Daniel P. Morris, Esq.; Perman & Green, LLP

(57) ABSTRACT

In one embodiment of the invention, source and drain regions are formed as well as source and drain contact regions. Thereafter source and drain extension regions are formed. In another embodiment, elevated source and drain regions are formed as well as source and drain extension regions. Thereafter source and drain contact regions are formed at a temperature up to about 600° C. and an annealing time of up to about one minute.

1 Claim, 16 Drawing Sheets

ELEVATED SOURCE DRAIN DISPOSABLE SPACER CMOS

CROSS-REFERENCES TO RELATED APPLICATIONS

This application is a divisional application of U.S. application Ser. No. 10/172,649, filed Jun. 14, 2002, now U.S. Pat. No. 6,777,298, the priority of which is hereby claimed.

This application is related to U.S. patent application Ser. No. 09/736,877, titled: SACRIFICIAL POLYSILICON SIDEWALL PROCESS AND RAPID THERMAL SPIKE ANNEALING FOR ADVANCE CMOS FABRICATION, filed Dec. 14, 2000, hereby incorporated by reference.

STATEMENT REGARDING FEDERALLY SPONSORED RESEARCH OR DEVELOPMENT

Not Applicable

BACKGROUND OF THE INVENTION

1. Field of the Invention

The present invention relates to a method of making CMOS devices, and more particularly, to one with an elevated source and drain and optionally having a halo region.

2. Description of the Related Art Including Information Disclosed Under 37 CFR 1.97 and 1.98

As CMOS technology becomes smaller, e.g., less than 50 nm gate length, it becomes more and more difficult to improve the short channel device performance and at the same time maintain acceptable values for off-state leakage current.

One technique for trying to achieve this is the halo technique wherein extra dopant implant regions are next to the sources and drain extension regions. For this to work the junctions must be abrupt, see "CMOS Devices below 0.1 nm: How High Will Performance Go?", by Y. Taur, et al., pp. 1–4. In particular, for sub 50 nm devices, not only the extension regions near the channel must be abrupt, i.e., less than 4 nm/decade, but the halo profile in proximity to the extension junction must be abrupt, i.e., less than 20 nm/decade.

Most of the prior art for the halo formation used a general approach wherein halo dopants are implanted at an angle ranging from 0° to 70° into the channel region. This prior art varied either the dose, halo dopants, or angle of halo implants for improving the device performance. The article "Halo Doping Effects in Submicron DI-LDD Device Design" by Christopher Codella et al., pp. 230–233, describes the optimum halo doses for improving the threshold voltage and the punch-through device characteristics. Punch-through stoppers was also discussed in the U.S. Pat. No. 5,320,974 by Atsushi Hori et al. which is similar to the conventional halo arrangements. The article "A 0.1 nm IHLATI (Indium Halo by Large Angle Tilt Implant) MOSFET for 1.0V Low Power Application" by Young Jin Choi et al. described the use of an indium halo and a large angle tilt for indium halo implants for improving the short channel characteristics. Other articles are "High Carrier velocity and Reliability of Quarter-Micron SPI (Self-Aligned Pocket Implantation) MOSEFETs" by A. Hori et al. and "A 0.1-μm CMOS Technology with Tilt-Implanted Punchthrough Stopper (TIPS)" by T. Hori.

None of the prior art focused attention on improving the abruptness of the halo dopant profiles in the area next to the channel. In these prior art situations, the halo dopants would have suffered enhanced transient diffusion and/or deactivation during contact and extension junction formation, and high thermal budget deep source/dran rapid thermal anneal (RTA) (typically 1000° C. for 5 seconds). Consequently, these much degraded halos severely compromised their usefulness for improving the short channel device characteristics, and this is especially the case for device channel width below 50 nm. Thus all the prior art approaches provide no means to minimize transient enhanced diffusion and/or deactivation of the halo dopants and hence cannot be used to create the abrupt super-halo (<20 nm/decade) in the region next to the channel area.

It is therefore desirable to have a process for making abrupt shallow PN junctions and haloes which does not cause dopant diffusion or deactivation.

BRIEF SUMMARY OF THE INVENTION

A method comprises forming source and drain regions; and thereafter forming source and drain extension regions.

A method comprises forming elevated and deep source and drain regions; forming source and drain extension regions; and thereafter forming source and drain contact regions at a temperature up to about 600° C. and an annealing time up to about one minute.

BRIEF DESCRIPTION OF THE SEVERAL VIEWS OF THE DRAWING(S)

FIGS. 1–6 show a process in accordance with first embodiment of the invention;

FIGS. 7(*a*) and 7(*b*) are graphs of etch rates;

FIGS. 8(*a*) and 8(*b*) are graphs of resistance verses RTA times;

DETAILED DESCRIPTION OF THE INVENTION

Figure 1:
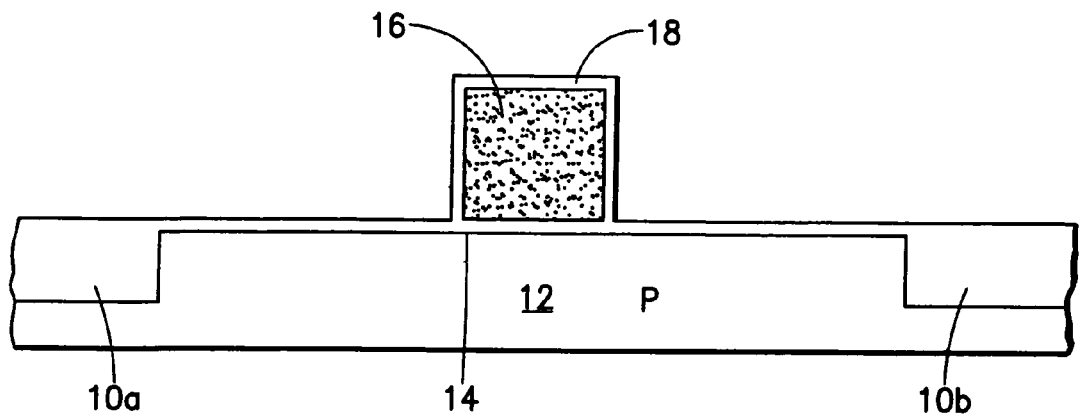
Figure 2:
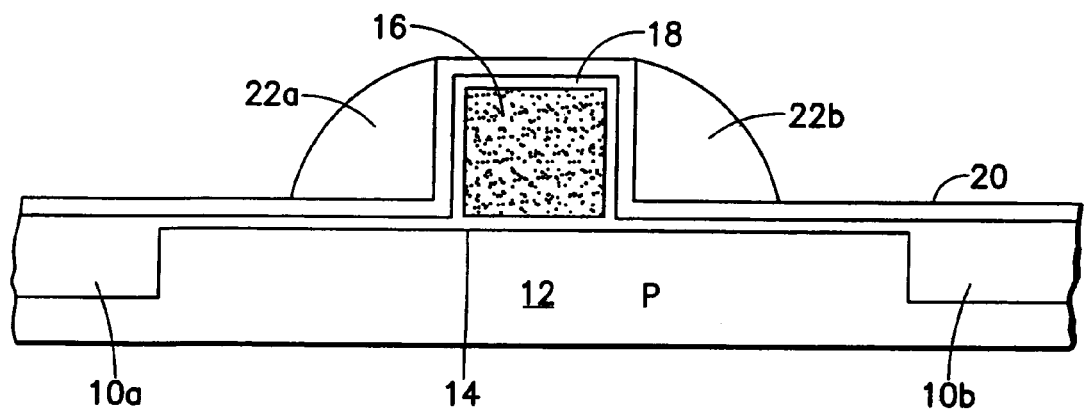

As shown in FIG. 1, silicon oxide with a thickness of between about 500 to 1000 nm as an insulating film for separating elements is formed in an element separation shallow trench isolation (STI) regions 10*a* and 10*b* of a P-type single crystal silicon semiconductor substrate 12. Silicon oxide film with a thickness of between about 1 to 3 nm as a gate insulating film is formed on an active region of the substrate 10. Then it is etched using known techniques to form the gate insulating layer 14. Then a gate electrode 16 with a thickness of between about 100 to 150 nm is formed by etching a deposited polycrystalline silicon film in ordinary photolithography and etching processes. A reoxidation is then done to form layer 18. Upon gate 16 is deposited the thin insulator first layer 20, preferably silicon nitride, which can be produced by chemical vapor deposition, sputtering, or related techniques. The layer 20 has a thickness of between about 5 nm to 50 nm, preferably between about 10–30 nm. Upon the layer 20 is deposited a second layer of material, such as SiO$_x$, a-Si, or polysilicon. In particular, this layer has a thickness of about between about 50 to 150 nm. This second layer is then defined by reactive ion etching (RIE) using a highly selective etch, e.g., p-Si etches at a rate about 200 times faster than Si$_3$N$_4$, thereby resulting in sidewalls 22a and 22b (FIG. 2) without damaging layer 20. During these etching steps, layer 20 acts as an etch stop layer.

Figure 3:
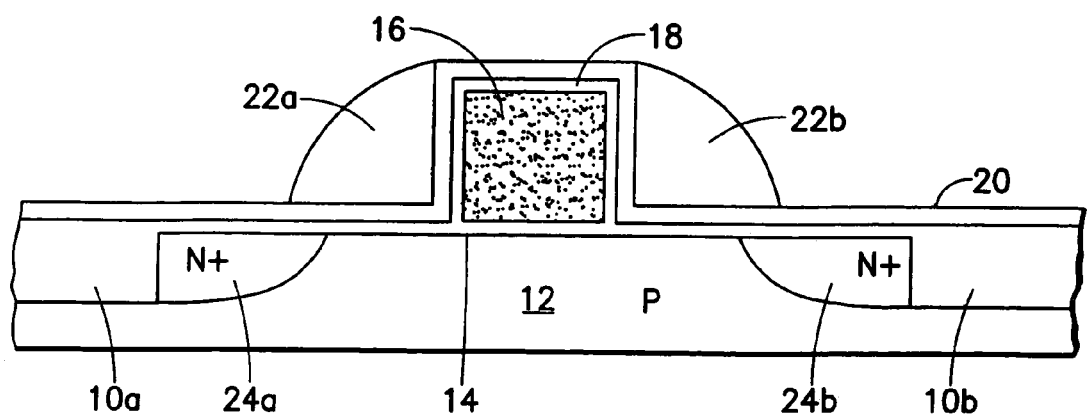

After spacer formation, ion implantation is performed to introduce dopants into substrate 12 forming regions 24a and 24b, (FIG. 3), which are spaced away from the edge of the gate 16 by a distance defined by the width of spacers 22 and layer 20. In one particular method, arsenic (As) ions are implanted into the substrate 12 at a dose of between about 3 to 10×10$^{15}$/cm$^2$ at about 50 KeV using the gate electrode 16 and the side wall spacers 22 as a mask, thereby forming an N$^+$-type deep source 24a and drain deep 24b regions. During this step, gate 16 is also ion implanted to make it a good conductor. For P$^+$ source/drain formation, B ions may be implanted at about 10 KeV with a dose of about 3 to 10×10$^{15}$/cm$^2$.

Figure 4:
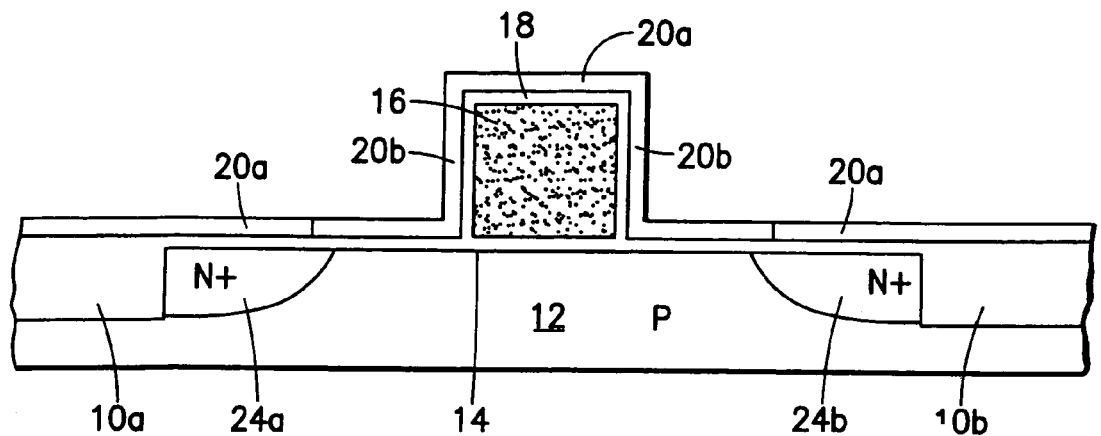

After formation of doped source/drain contact regions 24, the sidewall spacers 22 are selectively removed by well known methods such as reactive ion etching, or wet methods, the later preferably using a solution of KOH in the case of a polysilicon spacer, or HF in the case of an oxide spacer. The resulting structure, as shown in FIG. 4, contains implanted liner layer areas 20a as well as unimplanted liner layer areas 20b, which remain substantially unimplanted because of absorption of ions in the spacers 22 during the implantation step.

Figure 7B:
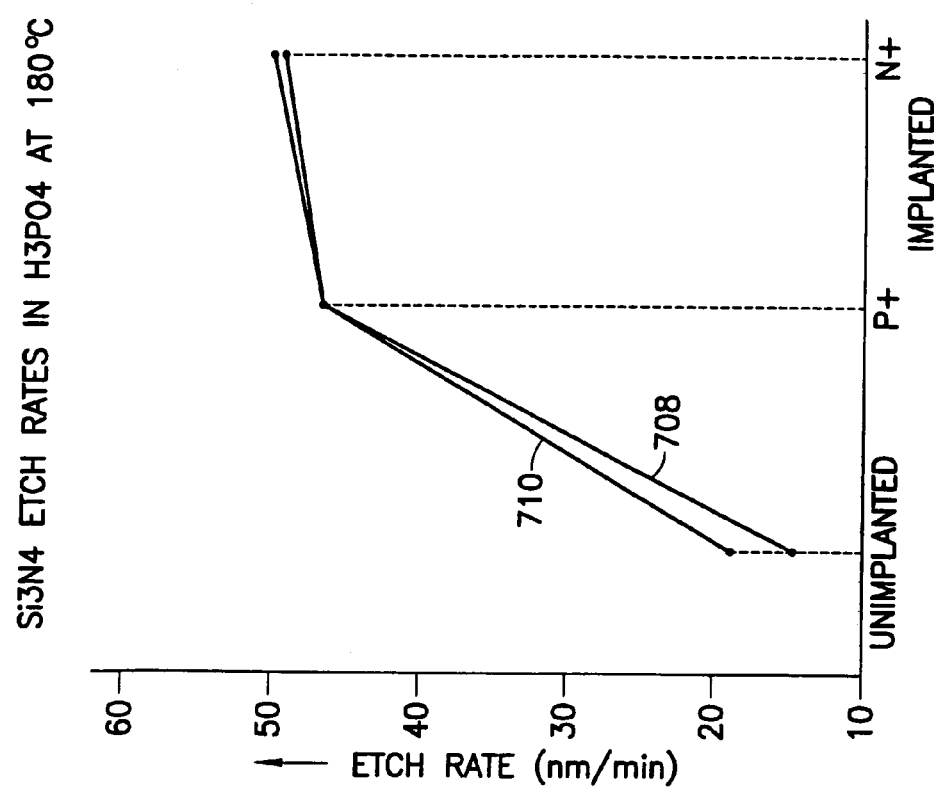
Figure 7A:
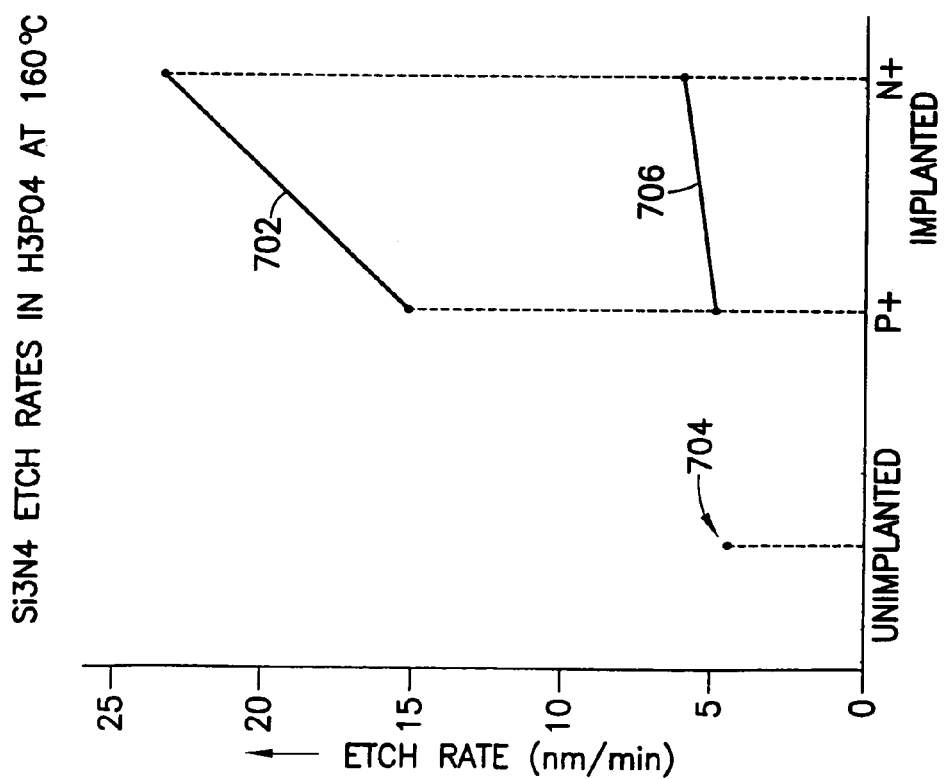

The next step comprises selective removal of the implanted liner areas 20a, leaving the unimplanted liner 20b intact. This is preferably accomplished by using hot phosphoric acid (H$_3$PO$_4$) at about 160° C. for between about 1 to 5 minutes, in the case where the liner 20 is silicon nitride. As FIG. 7(a) shows, the etch rate 702 of the implanted and unannealed nitride is much greater than the etch rate 704 for unimplanted nitride for both N-type and P-type dopants, while the etch rate 706 for implanted and annealled nitride is about the same as the etch rate 704 for unimplanted nitride. FIG. 7(b) shows that the nitride etch rate 708 for rapid thermal chemical vapor deposition (RTCVD) is about the same as the etch rate 710 for plasma enhanced chemical vapor deposition (PECVD). Thus, either RTCVD or PECVD can be used as a suitable layer in which the implantation causes a large increase in etch rate. Hence, removal of 200 Å layer 20a of N$^{-+}$ or P$^+$ implanted nitride at 160° C., would only remove about 35 Å or so Å, respectively, of the unimplanted layer 20b. A similar procedure could be performed using HF to selectively remove an implanted oxide layer with respect to an unimplanted oxide liner.

After selective removal of areas 20a, then the structure may be annealed between about 1000° C. and 1100° C., preferably about 1000° C., for between about 1 to 10 seconds, preferably about 5 seconds, to activate the source/drain 24 and gate 16 regions.

Figure 5:
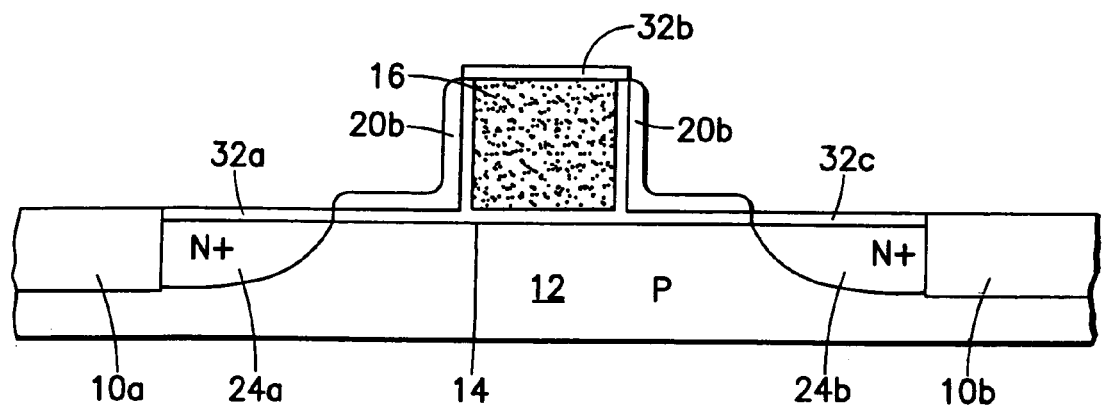
Figure 6:
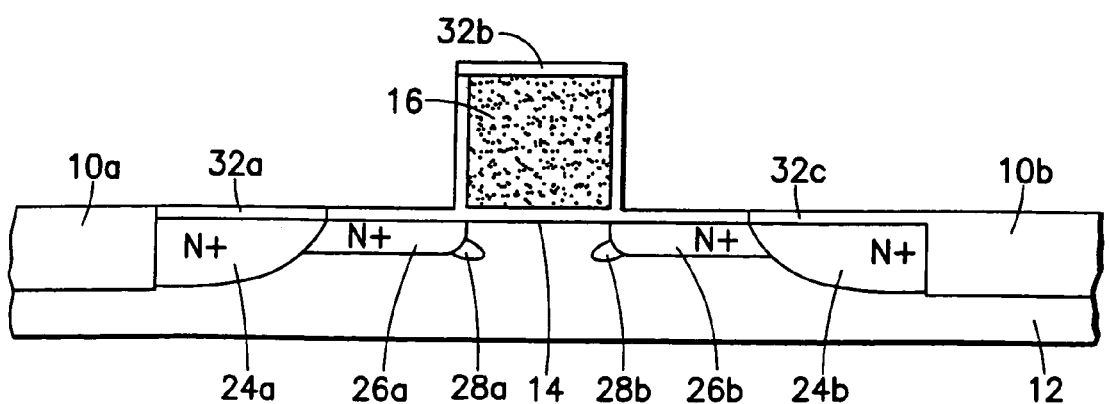

Any residual thin layer, such as less than 50 Å of oxide layers 14 and 18 is removed from on top of regions 16 and 24 by etching in HF. Subsequently, as shown in FIG. 5, silicide contacts 32a, 32b, and 32c are formed on the gate 16 (in the case of polysilicon gate) and source and drain regions 24 by well known self-aligned processes, such as salicide or direct selective CVD. Both processes are selective such that no silicide or metal remains on liner 20b, which is subsequently removed by wet etching using phosphoric acid in the case of nitride. Final steps involve ion implantation of shallow source/drain extension regions 26a and 26b (FIG. 6), with or without halo regions 28a and 28b, followed by high temperature annealing to activate the extension 26 and halo regions 28, if present.

In particular, arsenic (As) ions are implanted at a dose of 1 to 4×10$^{15}$ cm$^{-2}$ at an energy of between about 2 to 10 KeV using the gate electrode 16 as a mask thereby forming an N$^+$-type source extension region 26a and an N$^+$-type drain extension region 26b. Thereafter an optional annealing step of between about 1000° C. and 1050° C., preferably about 1000° C., for about 0 to 5 seconds, preferably about 1 second, is done in order to activate extension regions 26.

Optionally, boron (B) is then implanted at an energy of between about 3 to 10 KeV at a tilt angle between about 10 to 30 degrees with respect to a normal line of a main surface of substrate 12 and with four rotation around the normal axis and with a total areal dosage of between about 5×10$^{13}$/cm$^2$ to 5×10$^{14}$/cm$^2$ to form optional halo regions 28a and 28b. The condition of the ion implantation for forming the P$^+$ type halo regions 28 may be adjusted depending upon various factors such as an impurity concentration of the substrate 12, a desired value of the inversion threshold voltage, a minimum gate length and a drain structure. A dosage and a tilt angle of the ion implantation can be selected from a wide range. Boron fluoride ions (BF$_2^+$) and indium (In$^+$) ions are appropriate besides boron ions. Further the shape of halo regions 28 can be other than that shown as known in the art. For P$^+$ extension regions, BF$_2^+$ ions may be implanted at 1 to 10 KeV at an anneal dosage of between about 5×10$^{14}$/cm$^2$ to 3×10$^{15}$/cm$^2$. Thereafter, As is optionally implanted to an energy of about 3 to 30 KeV at a tilt angle of between about 10° to 30° to form N$^+$-type halo regions.

Thereafter an optional spike annealing, e.g., a ramp up rate of greater than about 100° C./s, a hold time of about zero seconds at a target temperature between about 800° to 1050° C., and a ramp down rate greater than about 50° C./s, is performed thus activating the dopants in the haloes 28 and, if said optional annealing steps were not done, also activate regions 24, 26, and gate 16. However, other types of annealing can be used. Further, separate annealing steps can be used for extensions 26 and haloes 28.

Spike annealing can be done by high powered tungsten (w) lamps, arc lamps, or excimer laser operating in the non-melting mode, e.g. less than 750 mJ/cm$^2$. Spike annealing has two advantages. One is that the wafer can get up to the high target temperature quickly so that the defect annealing with a higher activation energy (~5 ev) can be carried out with less time spent for undesirable halo dopant annealing with less activation energy (<4 eV). The second advantage of the spike anneal is the obvious advantage of much reduced thermal cycle due to the rapid thermal anneal cycle. As a result, the halo dopant motion during rapid thermal annealing is much reduced.

Figure 8A:
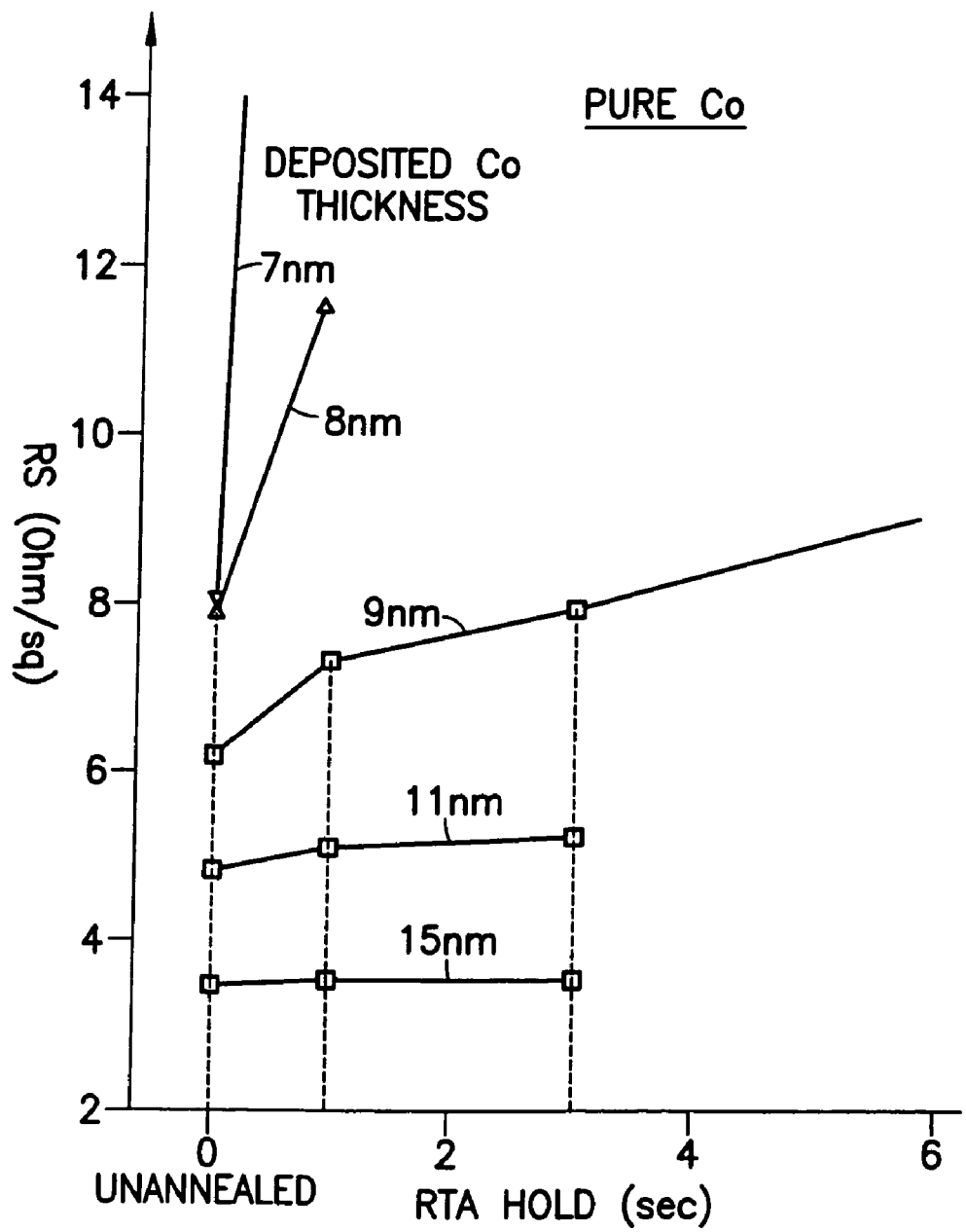

Conventional silicide of thickness less than 40 nm (11 nm Co thickness since the silicide thickness is 3.6 times the Co thickness) as shown in FIG. 8(a) is not stable, i.e., its resistivity increases with RTA hold time. Hence, if conventional silicide is used, it must be thicker than 40 nm to be stable during the extension anneal, which occurs subsequent to silicide formation. In order to form such a thick silicide, thick source and drain regions 24 and 26 must be used since they are partially consumed in silicide formation, or otherwise they will have an undesirably high resistance. But, if regions 24 and 26 are thick, then larger sidewall spacers 22 are needed, thereby resulting in an undesirably larger device.

Figure 8B:
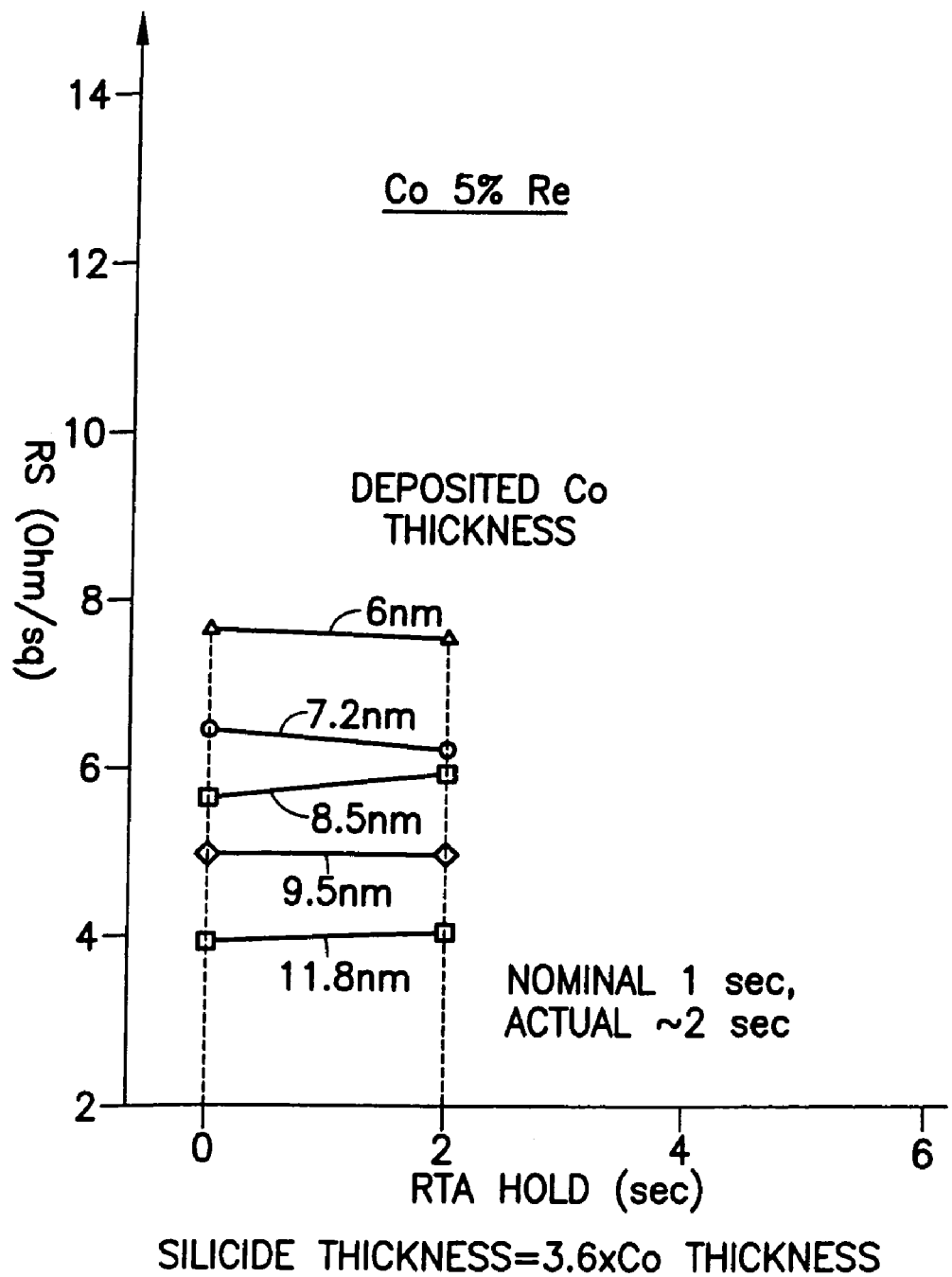

The current embodiment uses a high temperature-stable conductor, e.g. a silicide, which may comprise a ternary Si alloy, which is stable during high temperature annealing, such that the silicide layer 32 remains intact and still highly conductive after the final annealing steps are performed. As shown in FIG. 8(b), a known 5% Re alloy in Co as disclosed in U.S. patent application Ser. No. 09/519,898, filed Mar. 6, 2000, hereby incorporated by reference, is effective in accomplishing this. A key device advantage of the process and structure described in FIGS. 1 to 6 is that the silicide processing takes place before regions 24, 26, and, if present, 28 are formed, so that no high temperature steps which could degrade regions 24, 26 and 28 take place subsequent to formation of the latter.

Figure 9:
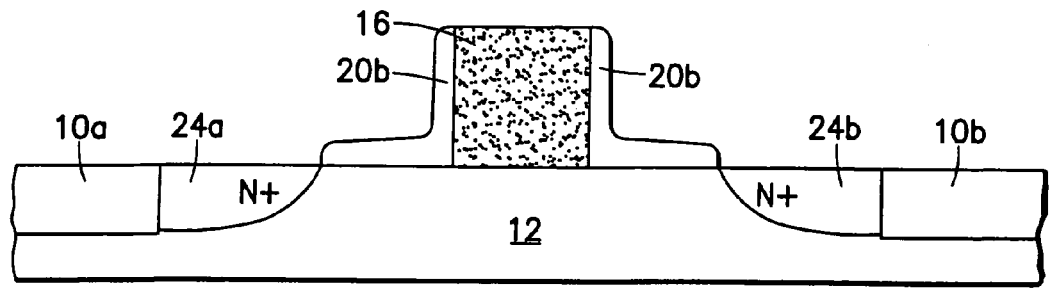
FIGS. 9–13 show a second embodiment of the invention.
Figure 10:
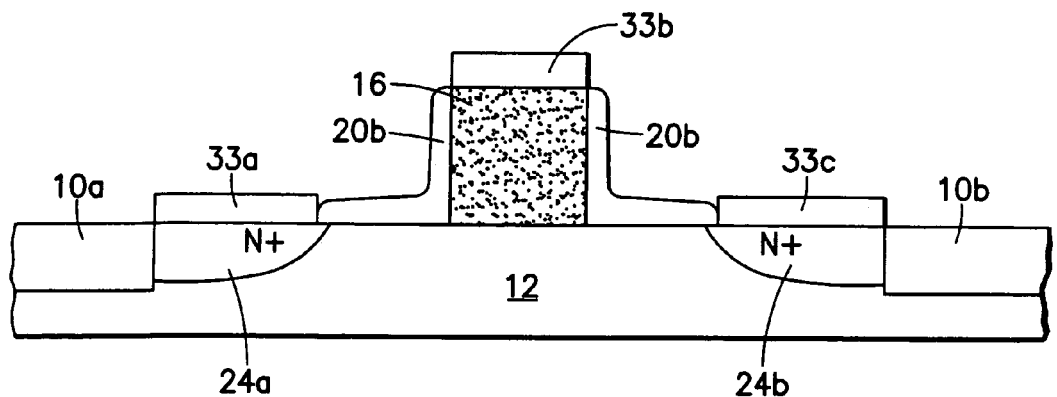
Figure 11:
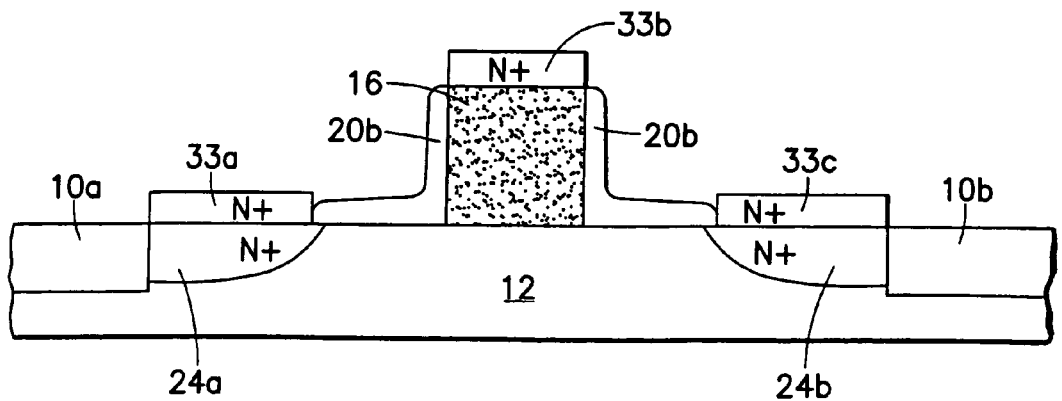

In a second embodiment of the invention, the process is the same as in the first embodiment up to FIG. 4. Thereafter, regions 20a are selectively removed as shown in FIG. 9 Regions 33a, 33b, and 33c comprising a selective silicon (or SiGe), preferably having a thickness of between about 50–1000 Å, are then formed on the source and drain regions 24 and on the gate 16, instead of silicide as describe in the first embodiment (FIG. 10). This is accomplished by well known CVD techniques at temperatures ranging from between about 550° C.–1000° C. preferably between about 700 and 900° C. An advantage of the current invention is that formation of regions 33, which often takes place at temperatures in excess of 900° C., occurs before formation of regions 24, 26, and 28 so that these regions 24, 26 and 28 are not degraded by high temperature processing after initial formation. Subsequent to selective silicon deposition to form an elevated source and drain structure, a shallow implant is done in regions 33 (FIG. 11). Then silicide formation takes place as in the first embodiment (FIG. 12), i.e., forming silicide within regions 33 and possibly extending into region 24. Then follows formation of regions 26a and 26b after removal of spacer 20b (FIG. 13). The advantage of the process of the second embodiment is that an elevated source/drain device is formed with all high temperature processes (generally defined as between about 600–1000° C. for silicide and selective silicon) taking place before regions 26 formation, ensuring maximum abruptness and activation of these regions. Another advantage of the present structure is that it provides a source for extra-thick silicide (in this embodiment the preferred silicide thickness is between about 40–60 nm) without penetration far into the regions 24, thus providing a more stable silicide layer for subsequent high temperature annealing.

Figure 14:
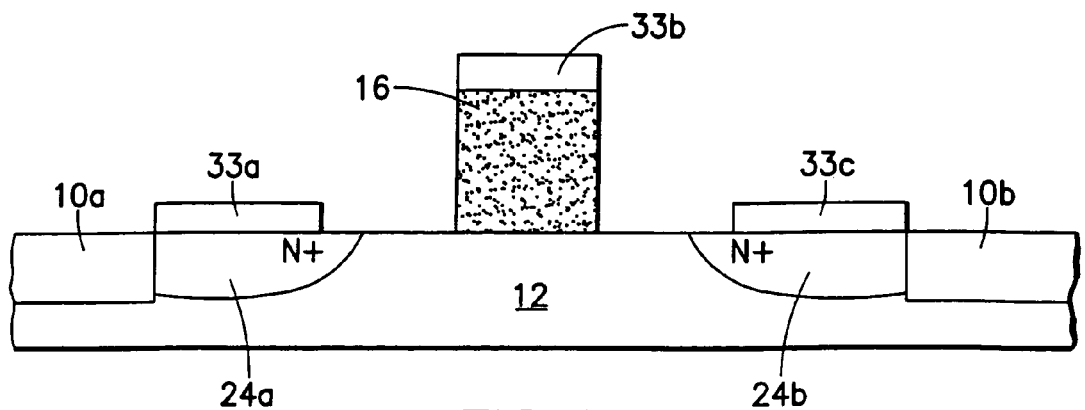
FIGS. 14–16 show a third embodiment of the invention.
Figure 15:
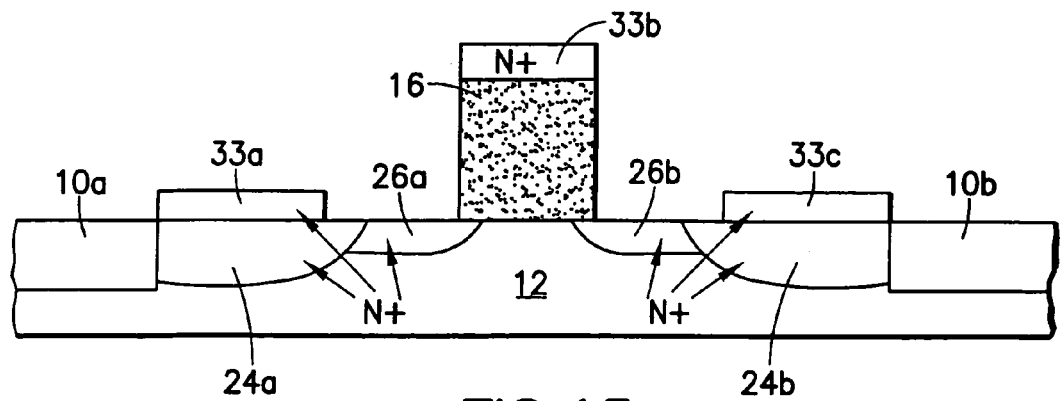
Figure 16:
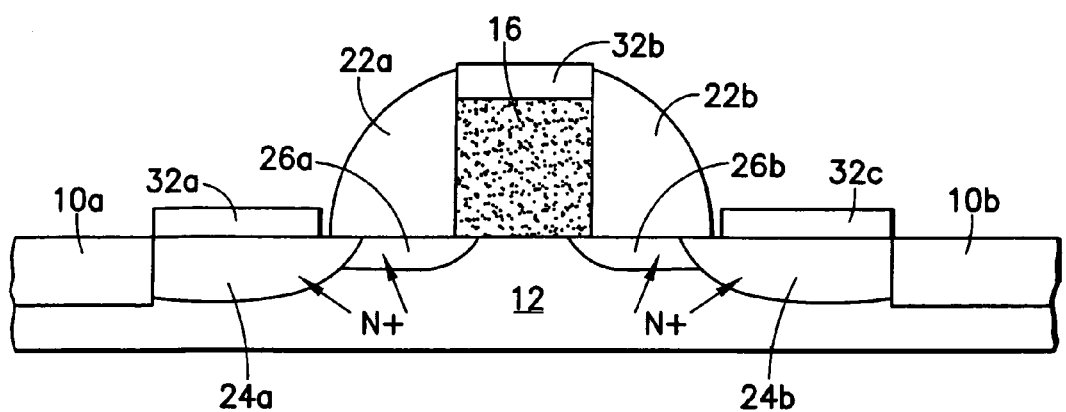

In a third embodiment, the process starts as in the second embodiment up to FIG. 10. The next step is removal of layer 20b (FIG. 14). Thereafter regions 26 and simultaneously contacts 33 are implanted (FIG. 15). Annealing to activate the dopants is done, and then permanent spacers 22a and 22b are formed using a typical material such as oxide or nitride, and subsequent silicide formation by known methods (FIG. 16). The advantage of this embodiment is that it does not require the silicide to withstand high temperature SDE/halo dopant activation anneals, but a preferred silicide material for this embodiment is NiSi, which forms at between about 400° C. to 600° C., for between 10 to 60 seconds, and does not deleteriously affect the SDE/Halo even though it occurs after halo formation.

Figure 12:
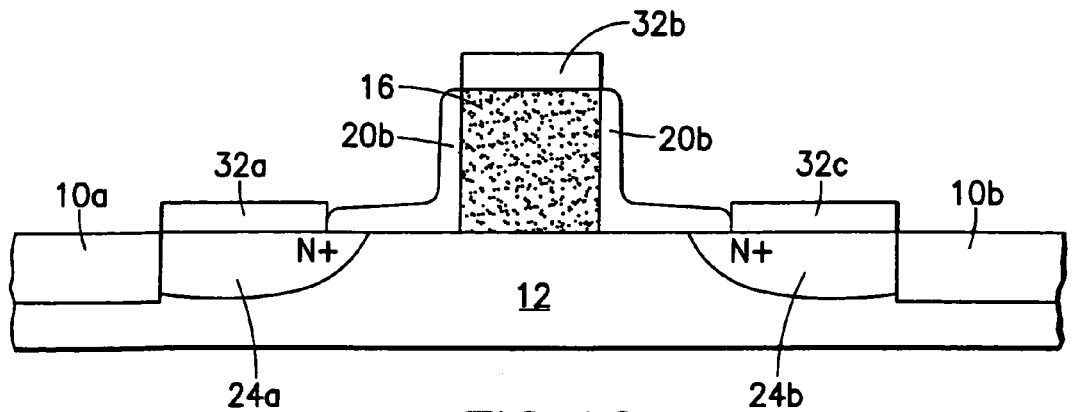
Figure 13:
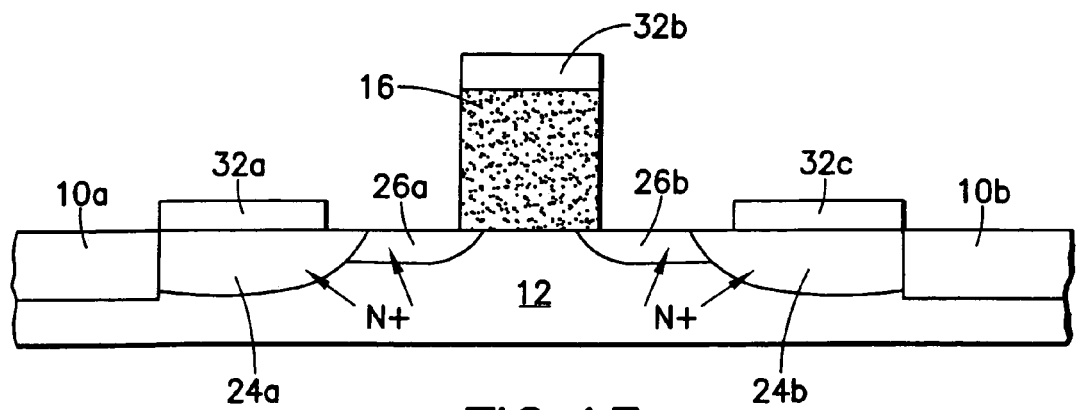
Figure 17:
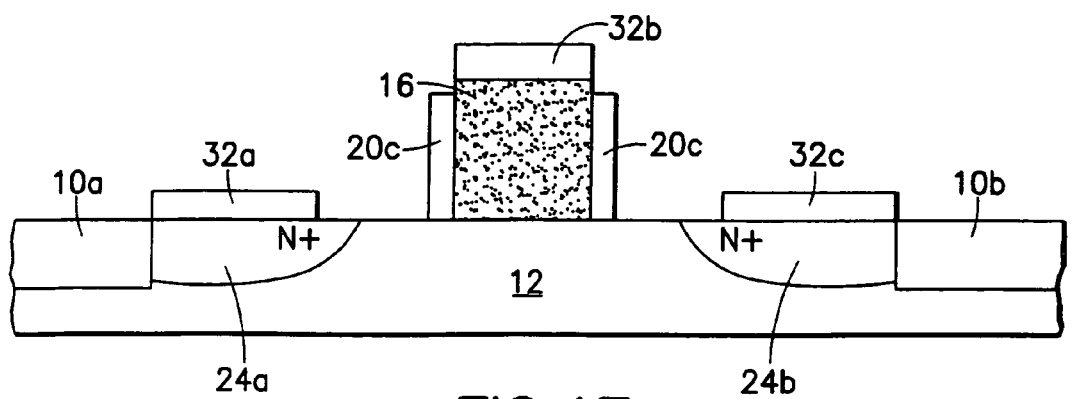
FIGS. 17 and 18 show a fourth embodiment of the invention.
Figure 18:
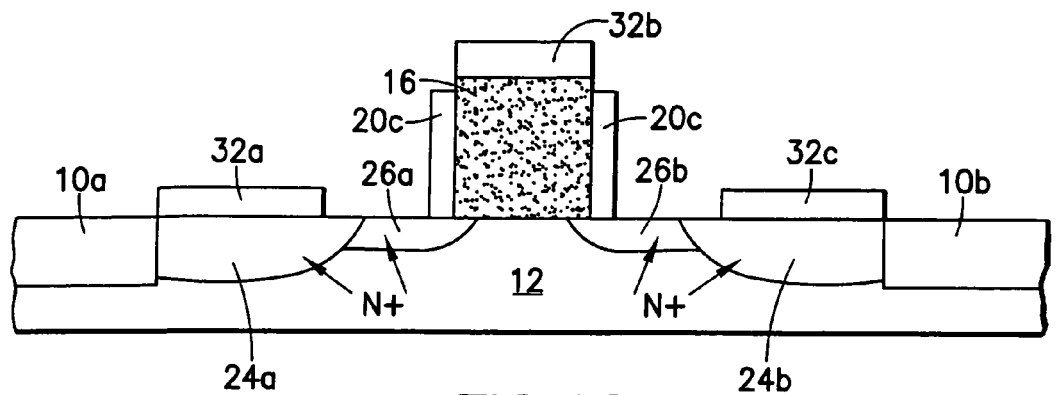

A fourth embodiment follows the sequence of the second embodiment up to all of the steps of FIG. 12. The next step is selective removal of the horizontal portion of layer 20b, which is accomplished preferably by reactive ion etching, leaving the vertical portion of the layer 20 in place as sidewalls 20c (FIG. 17). Subsequent ion implantation of regions 24 and 26 is performed and junctions are activated (FIG. 18). The advantage of this process is that it allows the dopants to be implanted at some distance laterally away from the gate edge, defined by the width of the nitride spacer 20c. This would be useful for fast-diffusing dopants such as B, where formation might result in too much overlap of regions 24 and 26 under the gate 16 after annealing, resulting in higher overlap capacitance.

In a fifth embodiment the previous steps are followed up to FIG. 10. Then the horizontal portion of nitride layer 20b is removed (FIG. 19) resulting in sidewalls 20c, followed by SDE/halo formation of region 26 (FIG. 20), permanent spacer 22 having portions 22a and 22b, (FIG. 21) and low temperature silicide contacts 32. This process differs from the fourth embodiment only in the use of a low temperature silicide at the end, and removes the need of ensuring high temperature silicide stability, and is preferably accomplished using low temperature silicide such as NiSi or PtSi.

Figure 20:
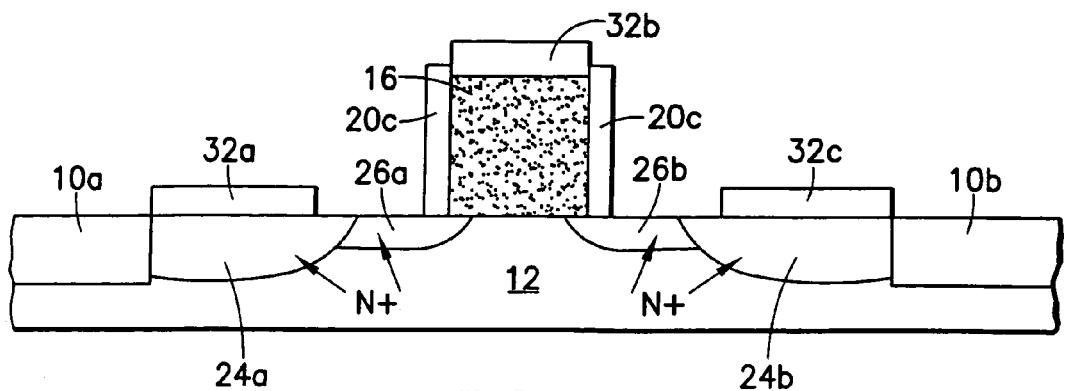
Figure 21:
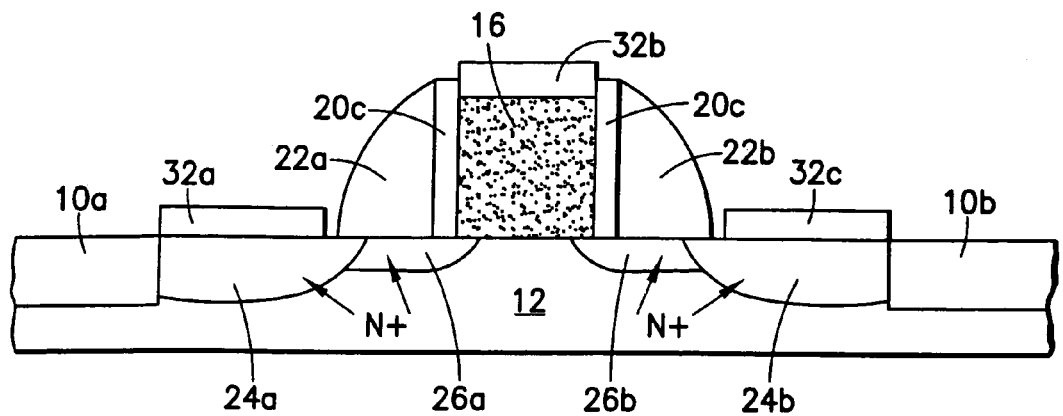
Figure 22:
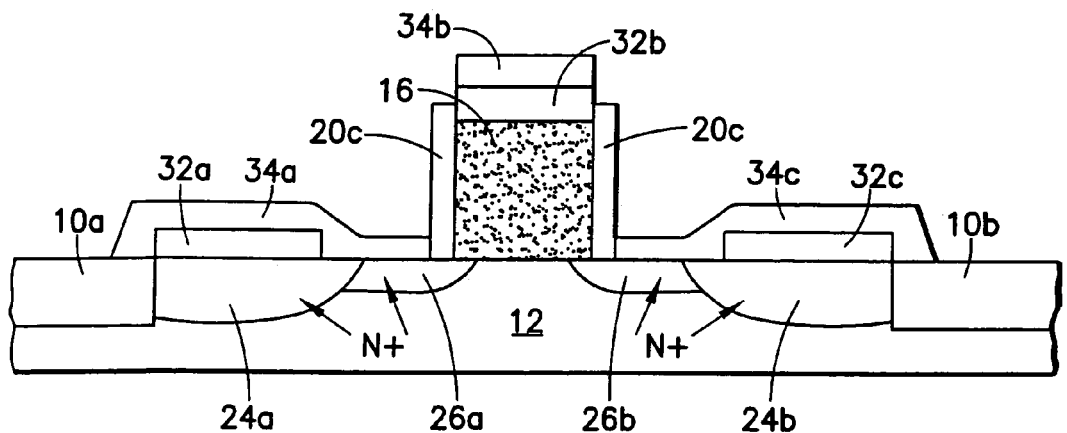
FIGS. 22–24 show a sixth embodiment.
Figure 23:
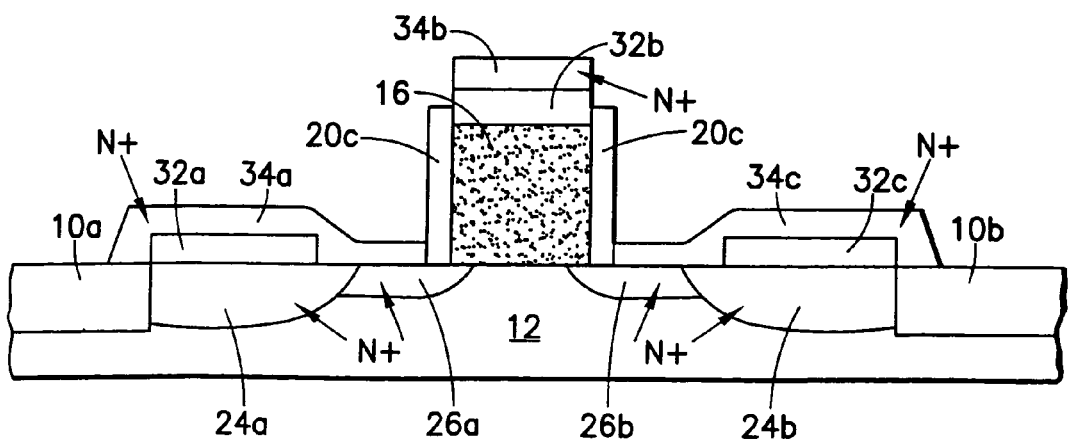
Figure 24:
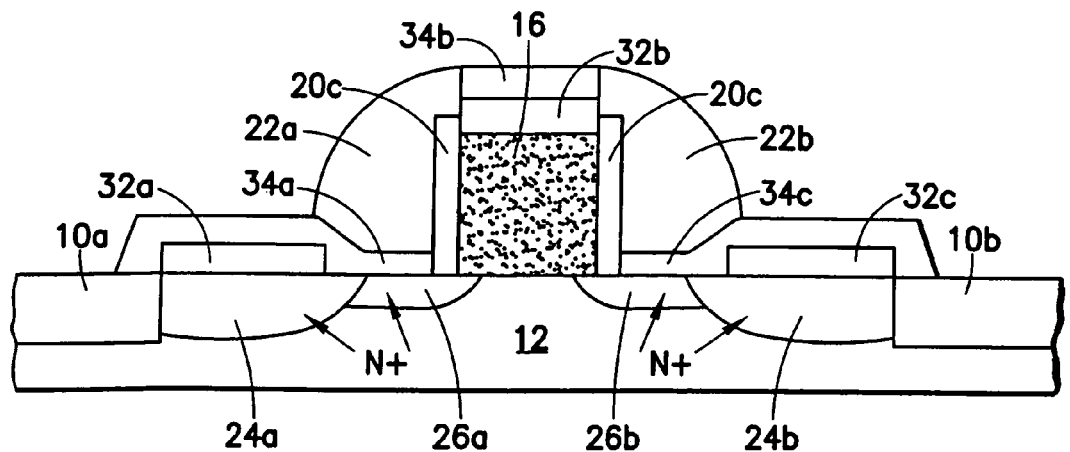

In a sixth embodiment, the previous steps are followed up to FIG. 20, after which a second selective layer 34, having sections 34a, 34b, and 34c, preferably Si or SiGe, of preferably between about 10–50 μm thickness, is grown, resulting in a stepped elevated source drain structure. The growth is preferably done using low temperature Si or SiGe, which can be done at between about 500–650° C., causing minimal impact on the regions 24 and 26 (FIG. 22). The second silicon layer 34 can subsequently be implanted (FIG. 23), followed by activation annealing forming regions 26 in the elevated region near the gate 16, and ending with the formation of permanent spacer 22 with portions 22a and 22b (FIG. 24) and low temperature silicide. This technique produces a structure which has low SDE resistance because of the elevation near the gate 16, but decouples the amount of silicon used to form the silicide contacts 32 with the amount of silicon near the gate 16, and thereby allows the overlap capacitance to be less than in a non-stepped structure.

Figure 19:
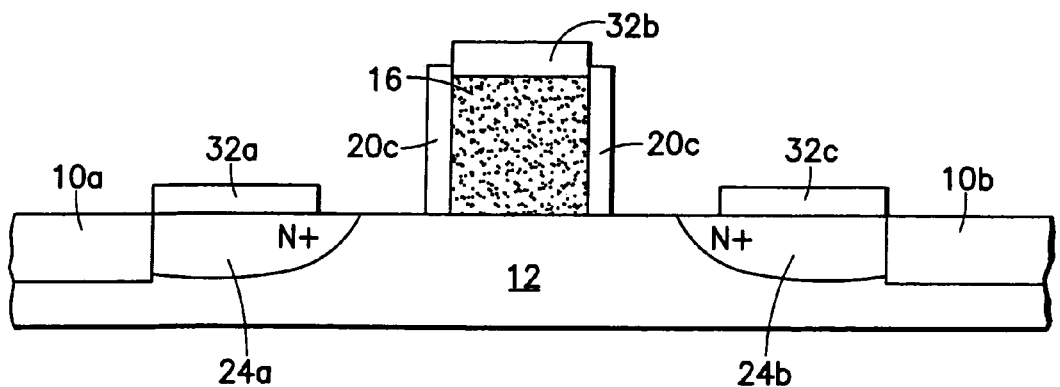
FIGS. 19–21 show a fifth embodiment of the invention.
Figure 25:
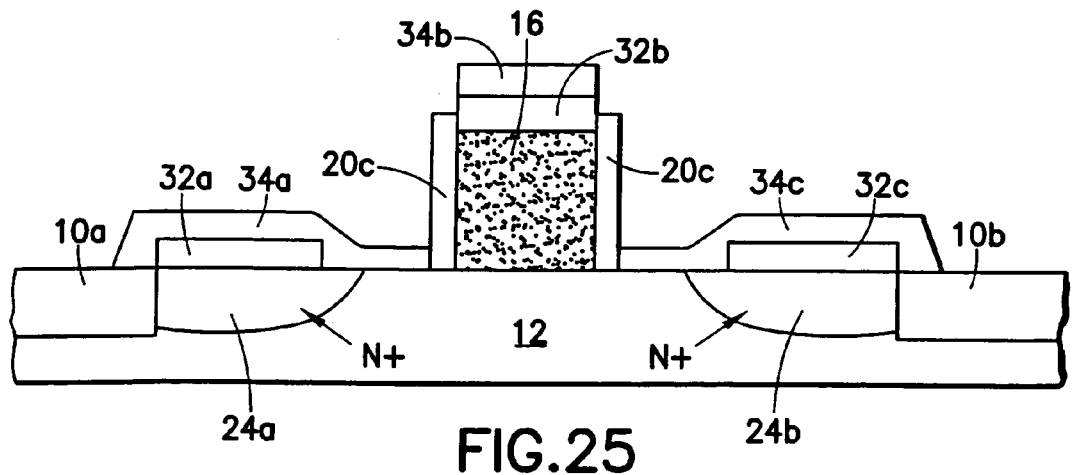
FIGS. 25–27 show a seventh embodiment.
Figure 26:
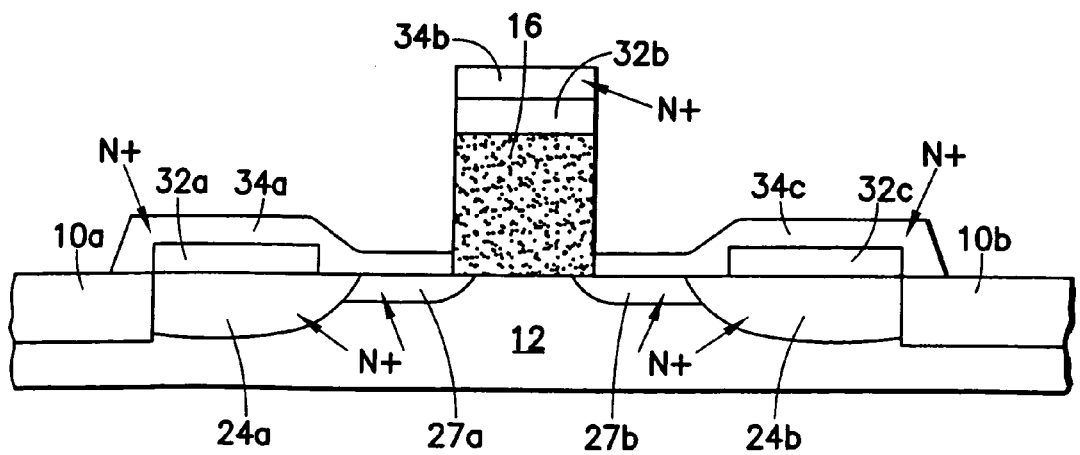
Figure 27:
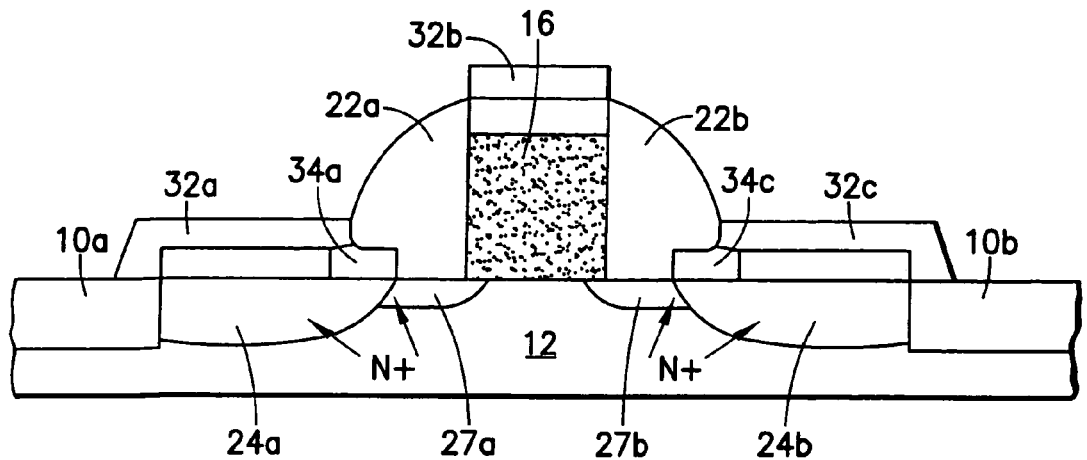

A seventh embodiment of the current invention involves following the preceding steps up to FIG. 19, but then depositing (FIG. 25), the second selective Si layer 34 having sections 34a, 34b, and 34c before implantation of regions 24 and 26, using etch to remove remaining nitride layer 20 (FIG. 26) next to the gate 16, and SDE formation, such that SDE ions can be located adjacent to the gate 16 edge with very low energy implant. This is followed by permanent sidewall spacer 22 having portions 22a and 22b formation (FIG. 27) and low temperature silicide contacts 32 formation, preferably using NiSi, PtSi, or related materials.

Figure 28:
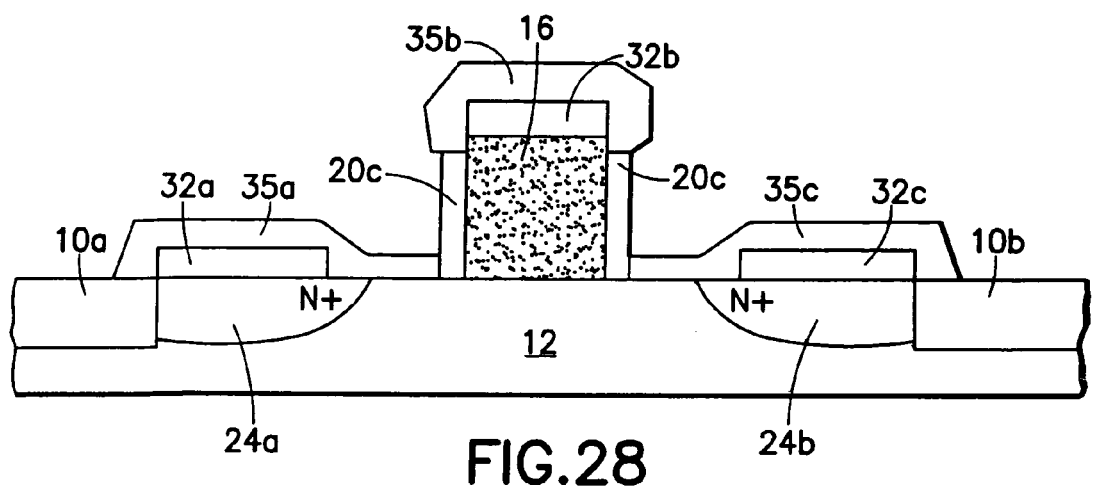
FIGS. 28–31 show an eighth embodiment.
Figure 29:
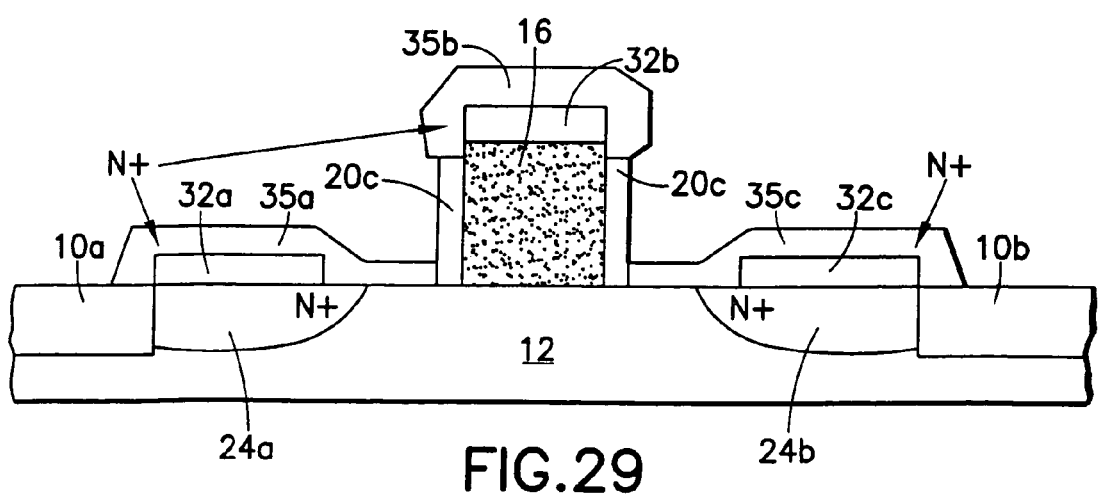
Figure 30:
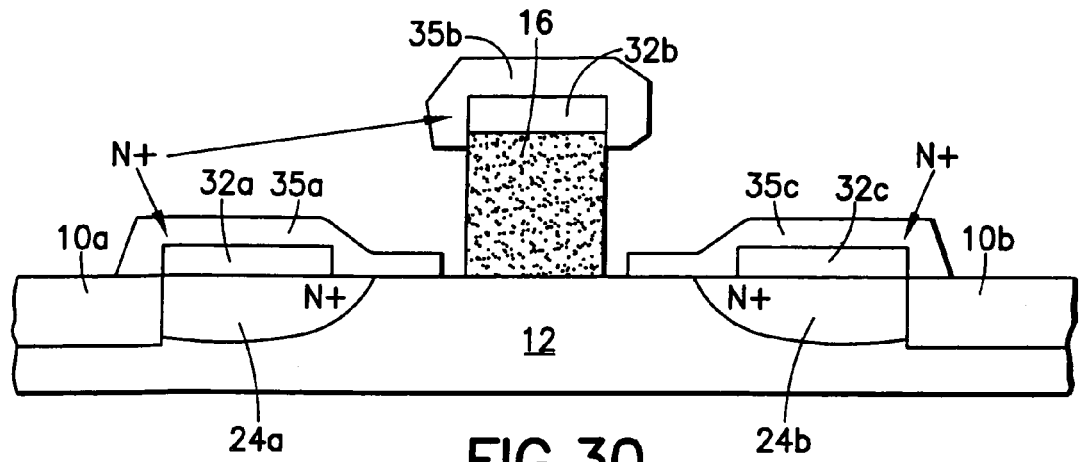
Figure 31:
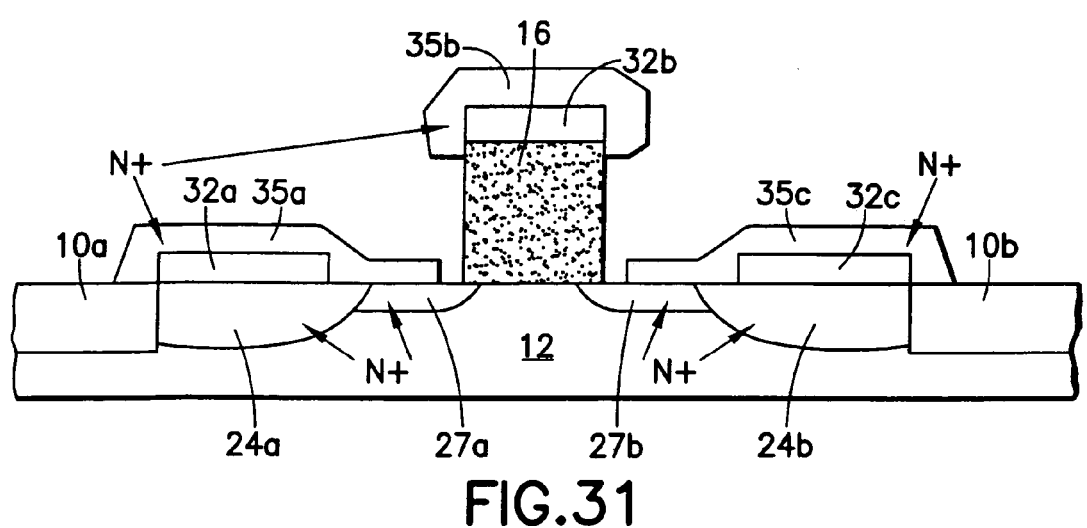

An eighth embodiment involves following the preceding steps up to FIG. 17, followed by selective deposition of silicon layer 35 (FIG. 28), which in addition to growing in the exposed Si area immediately adjacent to the gate 16, also may grow on the already present silicide in the source and drain 26 and 24 and gate 16 areas, since selective Si processes are selective to nitride and oxide, but may typically grow on silicide. The subsequent structure may be then implanted and annealed (FIG. 29). Then the thin nitride layer 20 removed (FIG. 30), followed by implantation of regions 27 for formation closer to the gate 16 (FIG. 31). The silicide layer 32 is buried before SDE anneal and will be more thermally stable, while the structure resulting is ideal from an electrical design, with low SDE resistance, low overlap capacitance, and ability to form ultra shallow junctions immediately adjacent to the gate 16 with no subsequent high temperature processing. The buried silicide layer 32 can easily be contacted by usual lithography and etch steps which will selectively remove the silicon layer 35 and leave the silicide layer 32 intact.

Figure 32:
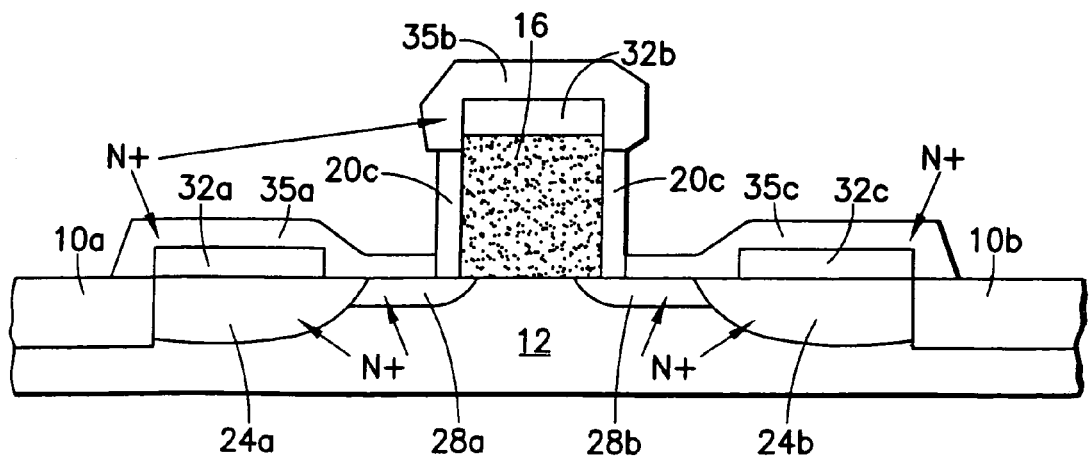
FIGS. 32 shows a ninth embodiment.

A ninth embodiment involves the previous steps up to FIG. 29, followed by ion implantation to form regions 28. In this embodiment, the vertical spacer 20c is retained in order to keep fast moving dopants from diffusing too far under gate 16 (FIG. 32).

Figure 33:
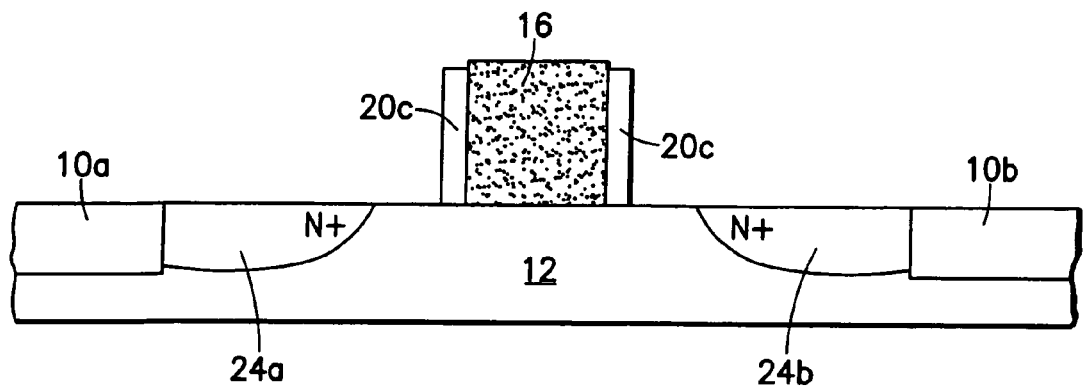
FIGS. 33–36 show a tenth embodiment.
Figure 34:
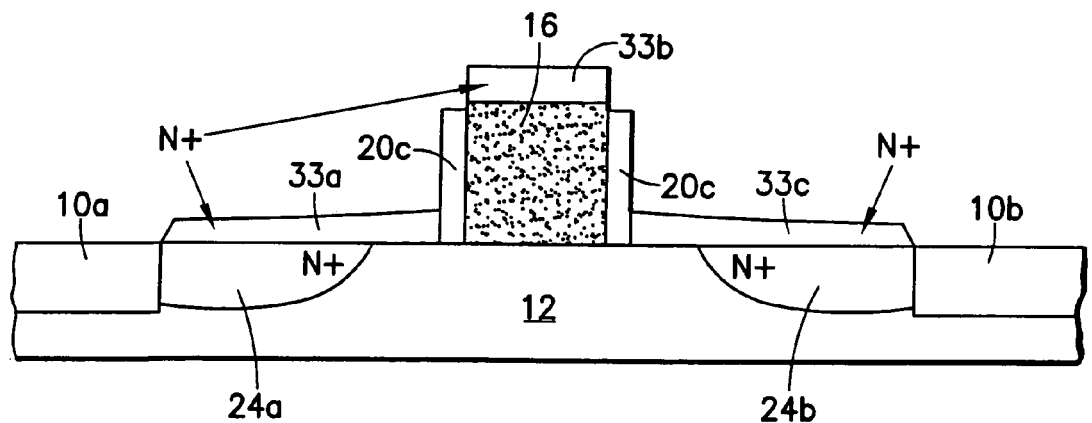
Figure 35:
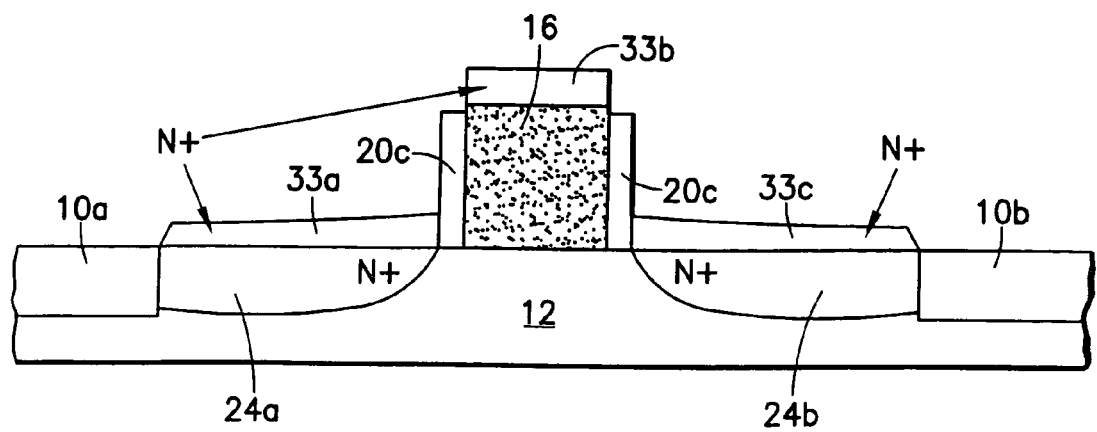
Figure 36:
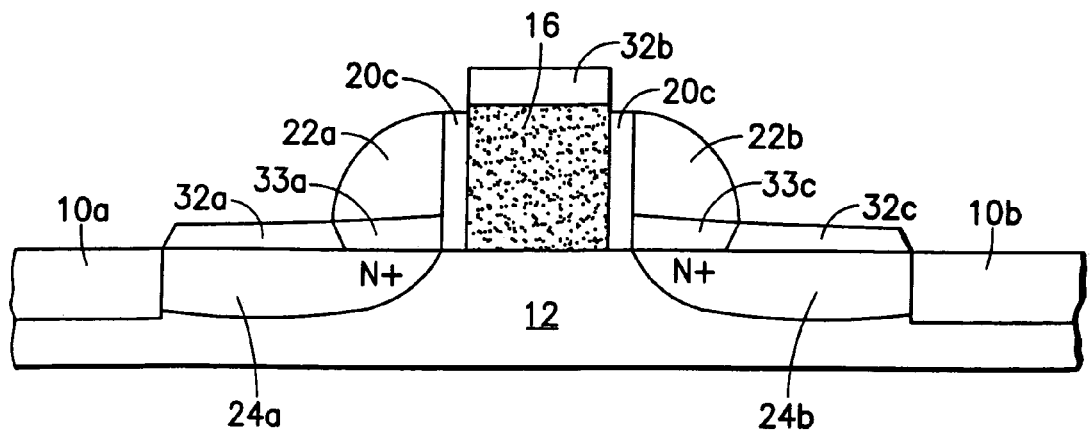

In the tenth embodiment, the steps are the same up to FIG. 4 followed by RIE to remove the horizontal portion of spacer 20b (FIG. 33). This is followed by selective Si growth (FIG. 34), implantation into region 33 and annealing (FIG. 35). Then permanent spacer 22 formation and low temperature silicide formation (FIG. 36) is done.

Figure 37:
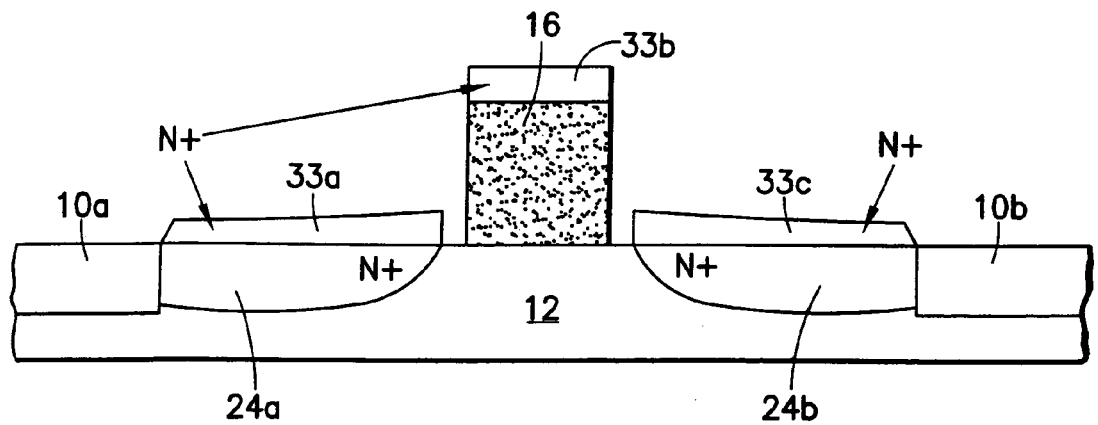
FIGS. 37–39 show an eleventh embodiment.
Figure 38:
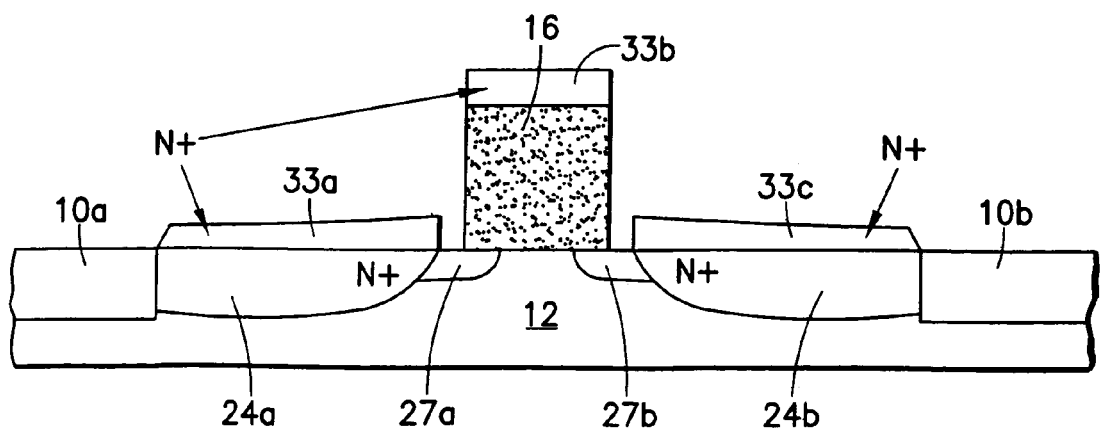
Figure 39:
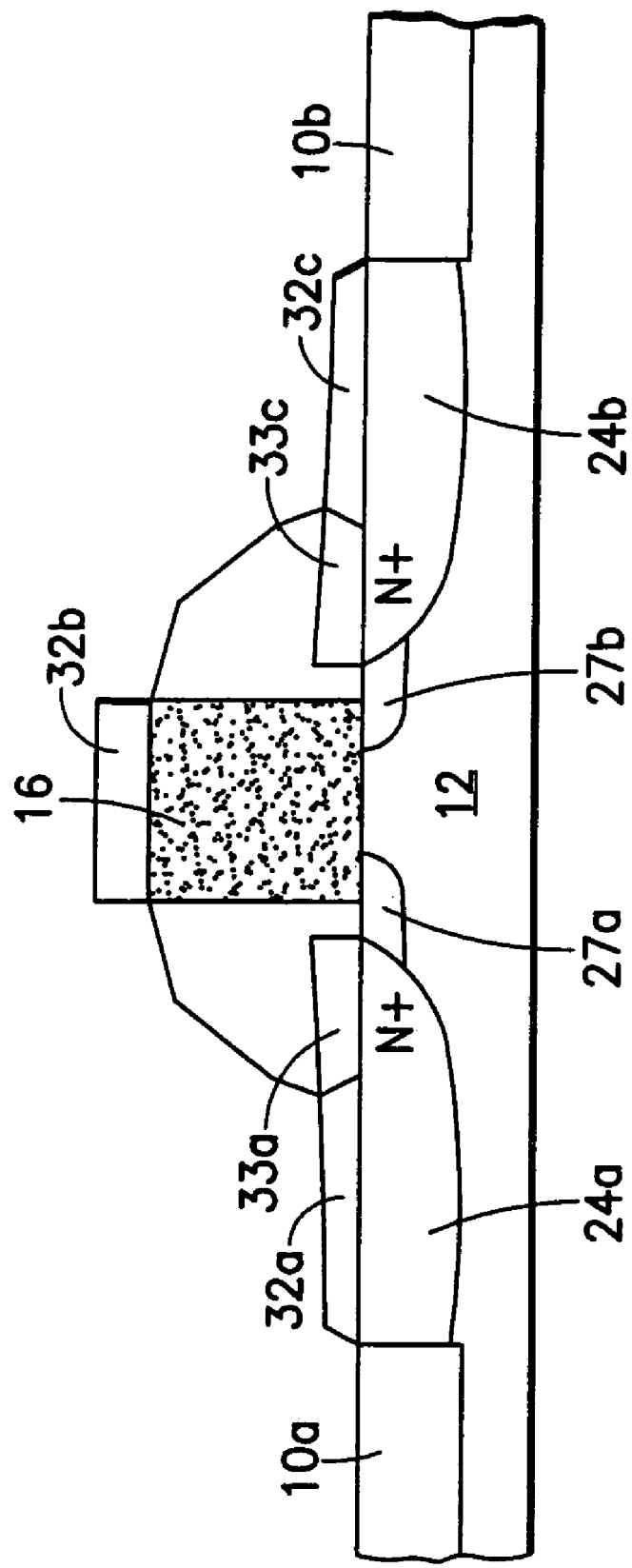

In the eleventh embodiment the steps are the same up to FIG. 35. Layer 20b is then selectively removed (FIG. 37), followed by implantation and annealing, which forms regions 27 near the edge of gate 16 (FIG. 38). This is followed by permanent spacer 22 and silicide formation (FIG. 39).

It will be appreciated that substrate 12 can also be of other group IV materials, e.g., C, Ge, SiGe alloy, Si-on-insulator (SOI), etc,; a group III–V material, e.g. GaAs, InP, AlGaAs, etc.; or a group II–VI material. Also for the P-type dopant B, In, Al and Ga can be used, while for the N-type dopant P, As, Sb can be used. Further, although most of the description is directed to N-channel devices, the present invention can be used to make P-channel devices by reversing conductivity types.

For the conductors, including gate 16, W, Al, Cu, Ti, Ni, P-SiGe alloy, heavily doped p-Si or a-Si, and combinations thereof can be used.

Further, the present invention can also be used in any device with a PN junction, e.g., diodes, bipolar transistors, etc.

While the present invention has been particularly described with respect to preferred embodiments, it will be understood that the invention is not limited to these particular preferred embodiments, the process steps, the sequence, or the final structures depicted in the drawings. On the contrary, it is intended to cover all alternatives, modifications, and equivalents as may be included within the spirit and scope of the invention defined by the appended claims. In addition, other methods and/or devices may be employed in the method and apparatus of the instant invention as claimed with similar results.

What is claimed is:

1. A method for forming spaced apart source and drain regions having areas for contact, said method comprising;

forming a dielectric layer on a semiconductor substrate, forming a gate electrode layer over said dielectric layer, patterning said gate electrode layer to form a gate electrode over said dielectric layer, forming a temporary spacer on the sidewalls of said gate electrode by forming a dielectric liner of a first material and one of a dielectric or semiconductor layer of a second material, etching said second material, whereby said second material forms a sidewall spacer of controlled width which is determined by the original thickness of the layer of said second material, performing blanket ion implantation on the resulting structure, whereby ions pass through said dielectric liner of said first material and are substantially absorbed where incident on said sidewall spacer of said second material and whereby said liner of said first material underneath said sidewall spacer is protected, selectively removing said second material with respect to said first material, selectively etching said first material where damaged by ion implantation, whereby said first material remains on the sidewalls of said gate electrode and remains where said first material was formerly underneath said second material of said sidewall spacer and protected from ion implantation, annealing ion implanted regions in said substrate to form source and drain regions electrically contactable through openings in said first material, selectively depositing on source and drain regions a silicon containing semiconductor material, selectively removing said liner of said first material, implanting dopants of a first conductivity type on either side of said gate electrode, annealing to form source and drain extension regions, and forming a silicide on exposed source and drain regions.

* * * * *